United States Patent
Deneuville

(10) Patent No.: US 11,327,106 B2
(45) Date of Patent: May 10, 2022

(54) SYSTEM AND METHOD FOR LOCATING FAULTS ON A POLYPHASE ELECTRICAL NETWORK USING POSITIVE AND NEGATIVE SEQUENCE VOLTAGE VARIATION

(71) Applicant: Electricite de France, Paris (FR)

(72) Inventor: Boris Deneuville, Montrouge (FR)

(73) Assignee: Electricite de France

( * ) Notice: Subject to any disclaimer, the term of this patent is extended or adjusted under 35 U.S.C. 154(b) by 0 days.

(21) Appl. No.: 17/255,739

(22) PCT Filed: Jun. 27, 2019

(86) PCT No.: PCT/EP2019/067262
§ 371 (c)(1),
(2) Date: Dec. 23, 2020

(87) PCT Pub. No.: WO2020/002561
PCT Pub. Date: Jan. 2, 2020

(65) Prior Publication Data
US 2021/0263092 A1    Aug. 26, 2021

(30) Foreign Application Priority Data
Jun. 28, 2018  (FR) ...................... 1855883

(51) Int. Cl.
*G01R 31/08* (2020.01)
*G01R 19/25* (2006.01)

(52) U.S. Cl.
CPC ....... *G01R 31/088* (2013.01); *G01R 19/2513* (2013.01); *G01R 31/086* (2013.01)

(58) Field of Classification Search
None
See application file for complete search history.

(56) References Cited

U.S. PATENT DOCUMENTS 7,956,637 B2 * 6/2011 Lu .................. G01R 31/343
324/765.01
2008/0097706 A1   4/2008 McCormack et al.
(Continued)

FOREIGN PATENT DOCUMENTS

DE   3636367 A1   4/1988
EP   0933643 A1   8/1999
(Continued)

OTHER PUBLICATIONS

French Search Report for FR1855883 dated Mar. 14, 2019; 3 pages.
International Search Report for PCT/EP201/067262 dated Sep. 24, 2019; 3 pages.

*Primary Examiner* — Arleen M Vazquez
*Assistant Examiner* — Brandon J Becker
(74) *Attorney, Agent, or Firm* — Lerner, David, Littenberg, Krumholz & Mentlik, LLP

(57) ABSTRACT

A system for detecting a fault in a polyphase electrical network, characterized by the fact that it comprises a plurality of sensors distributed over the electrical network and suitable for measuring a parameter representative of the positive sequence voltage and/or the negative sequence voltage at each respective sensor and analyzing means suitable for analyzing the signals coming from the different sensors representative of the positive sequence voltage and/or the negative sequence voltage at each respective sensor, by searching for an extremum from among the signals coming from the sensors and for locating a fault at the sensor corresponding to this extremum.

30 Claims, 16 Drawing Sheets

(56) References Cited

U.S. PATENT DOCUMENTS

| | | | | |
|---|---|---|---|---|
| 2010/0102824 A1* | 4/2010 | Tremblay | ............ | G01R 31/088 |
| | | | | 324/522 |
| 2016/0336928 A1* | 11/2016 | Kuznetsov | ................ | H02J 3/30 |
| 2017/0336465 A1* | 11/2017 | Pignati | ................. | G01R 31/086 |

FOREIGN PATENT DOCUMENTS

| | | | | |
|---|---|---|---|---|
| EP | 2533060 A1 * | 12/2012 | ............... | H02H 5/10 |
| EP | 2533060 A1 | 12/2012 | | |
| FR | 2936378 A1 * | 3/2010 | ............... | H02H 3/34 |
| FR | 2936378 A1 | 3/2010 | | |
| FR | 2976363 A1 | 12/2012 | | |
| FR | 3028620 A1 * | 5/2016 | ........... | G01R 31/088 |
| FR | 3028620 A1 | 5/2016 | | |
| IE | S20050382 A2 | 12/2005 | | |
| JP | 2004061142 A | 2/2004 | | |

\* cited by examiner

Direct voltages

Inverse voltages

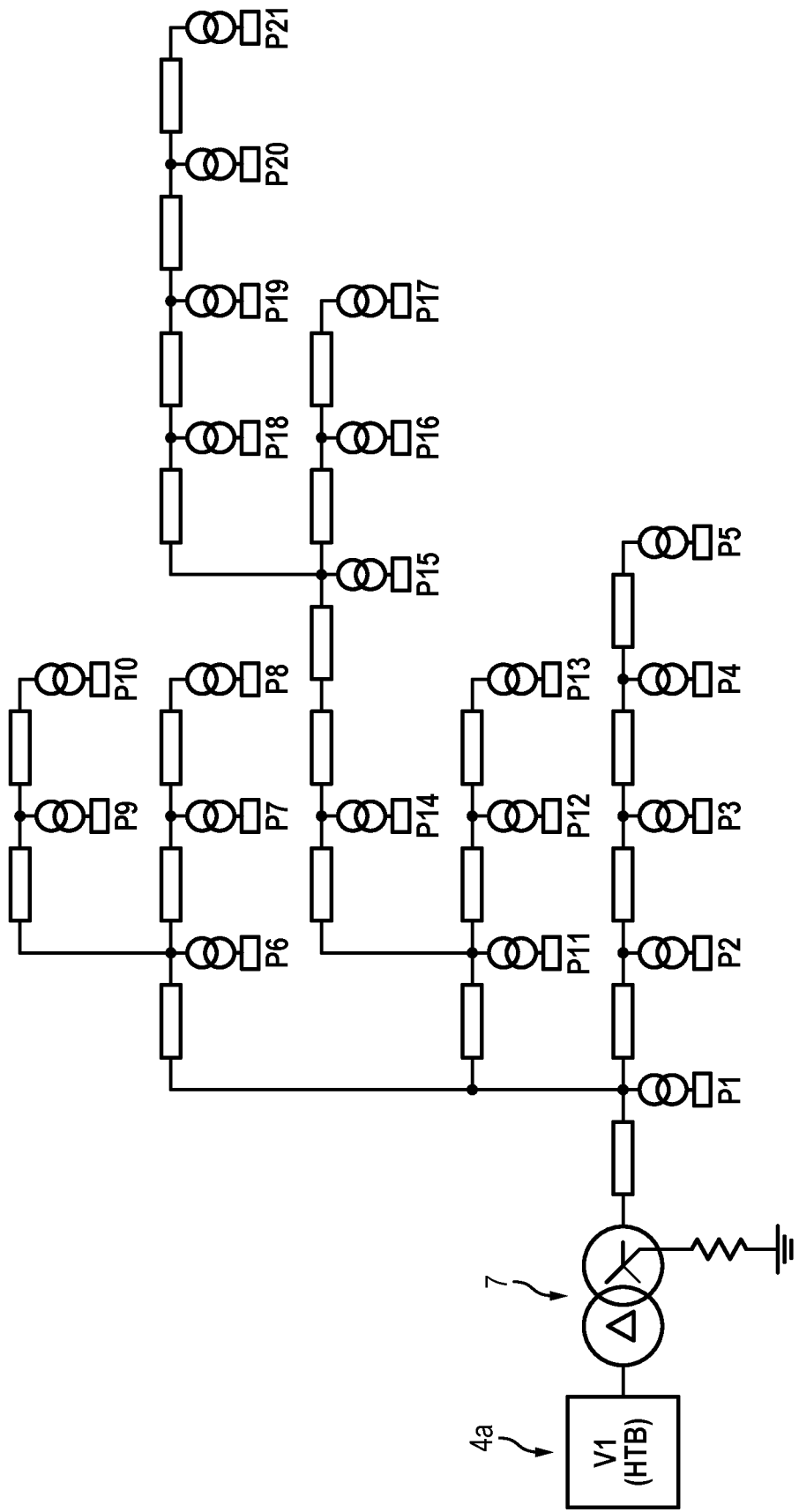

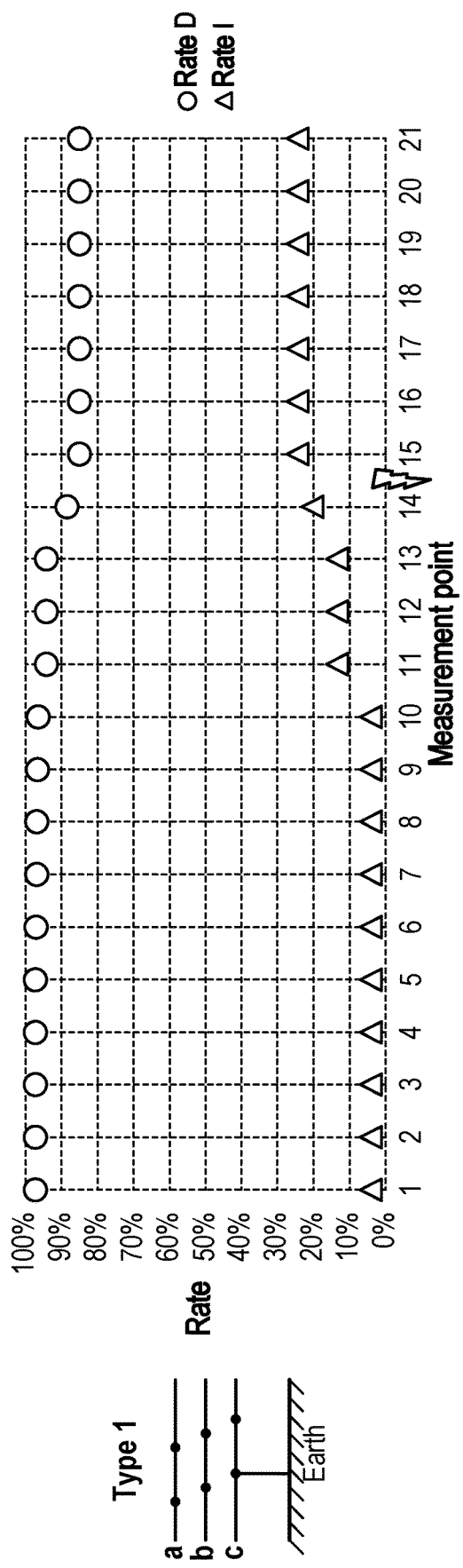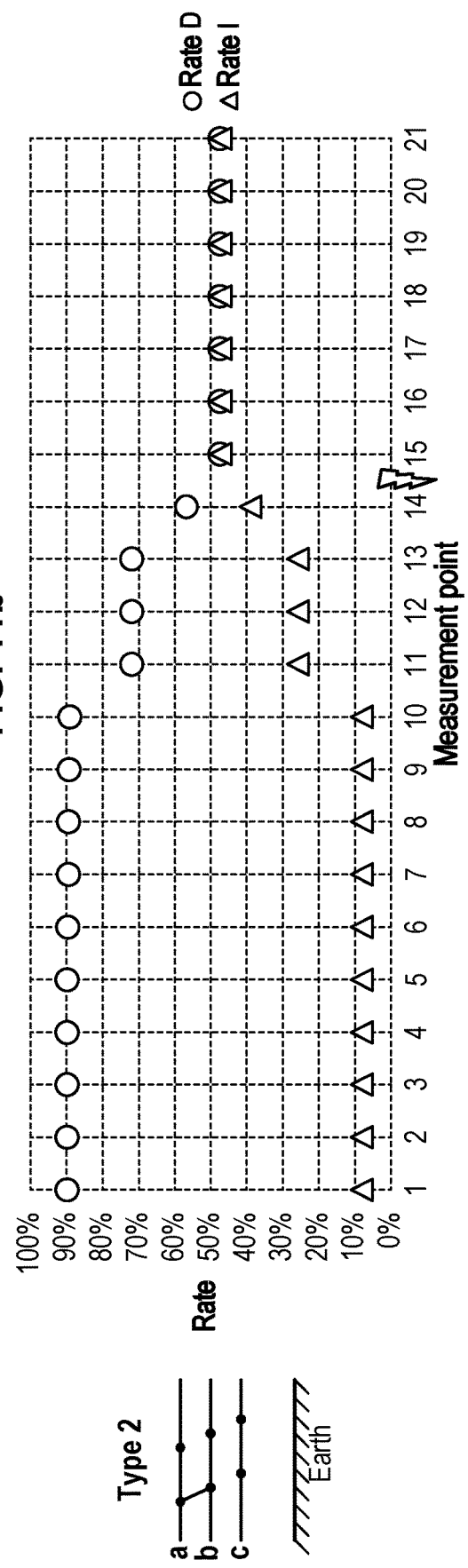

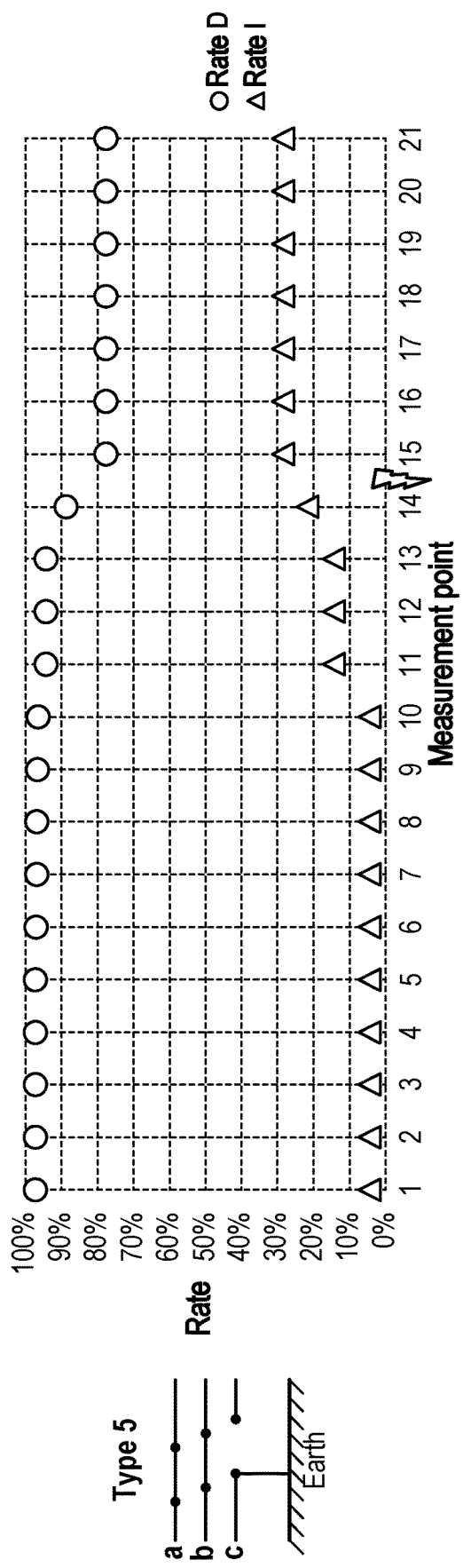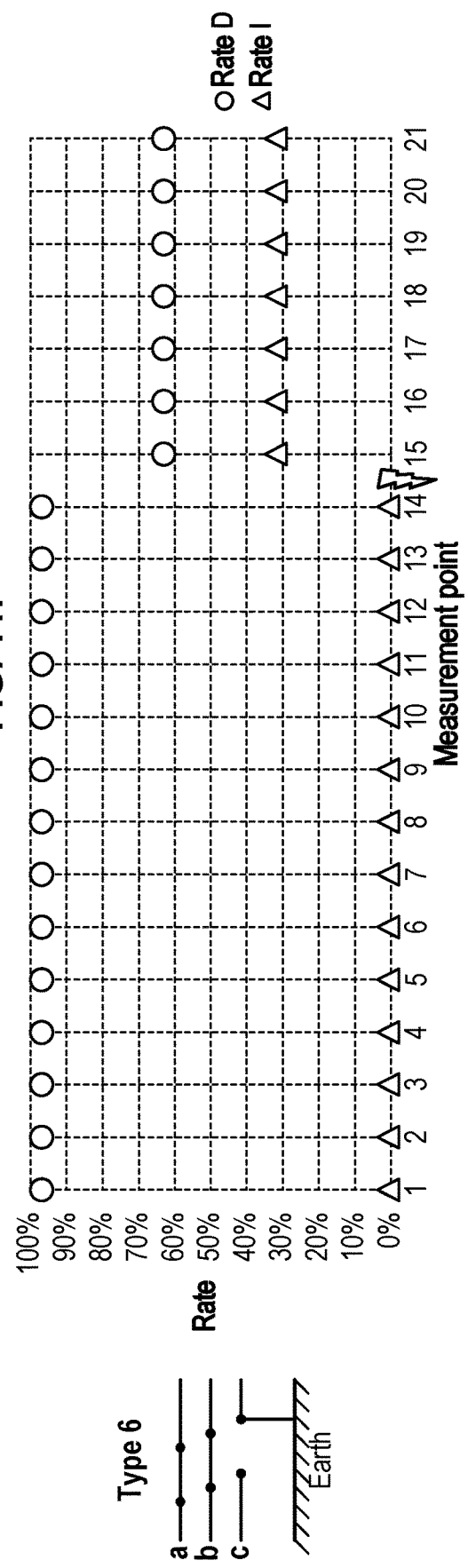

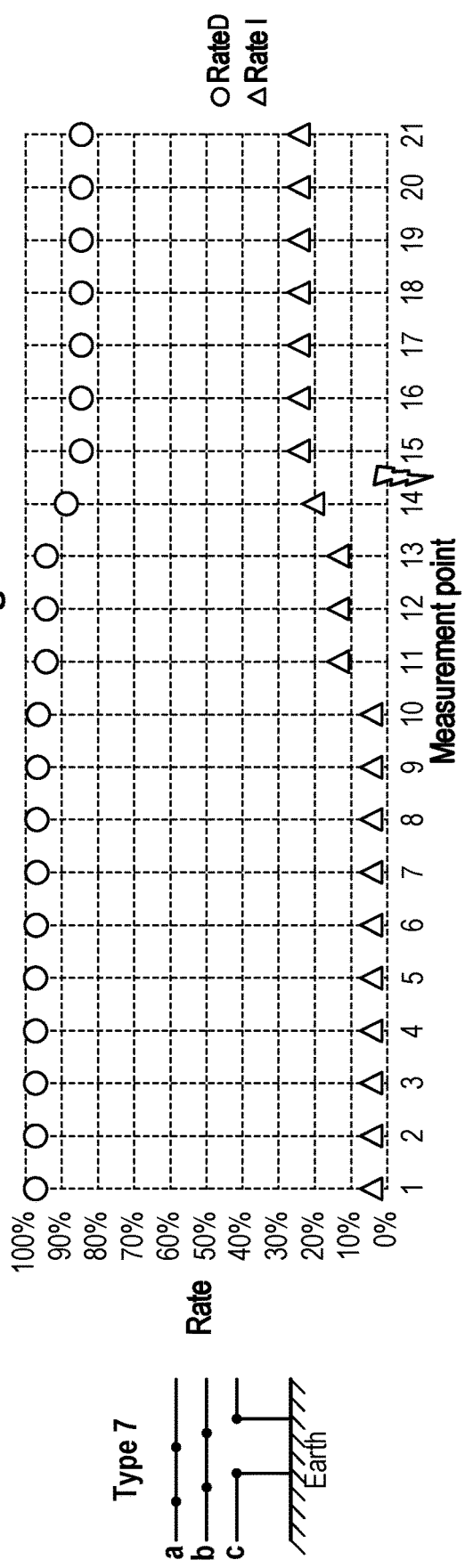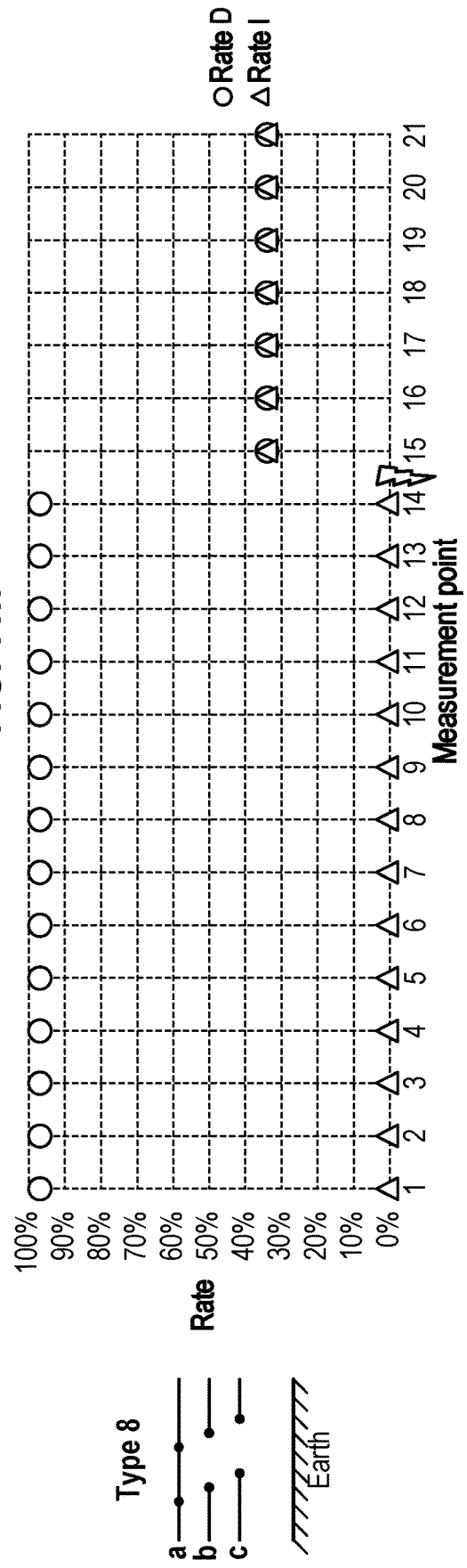

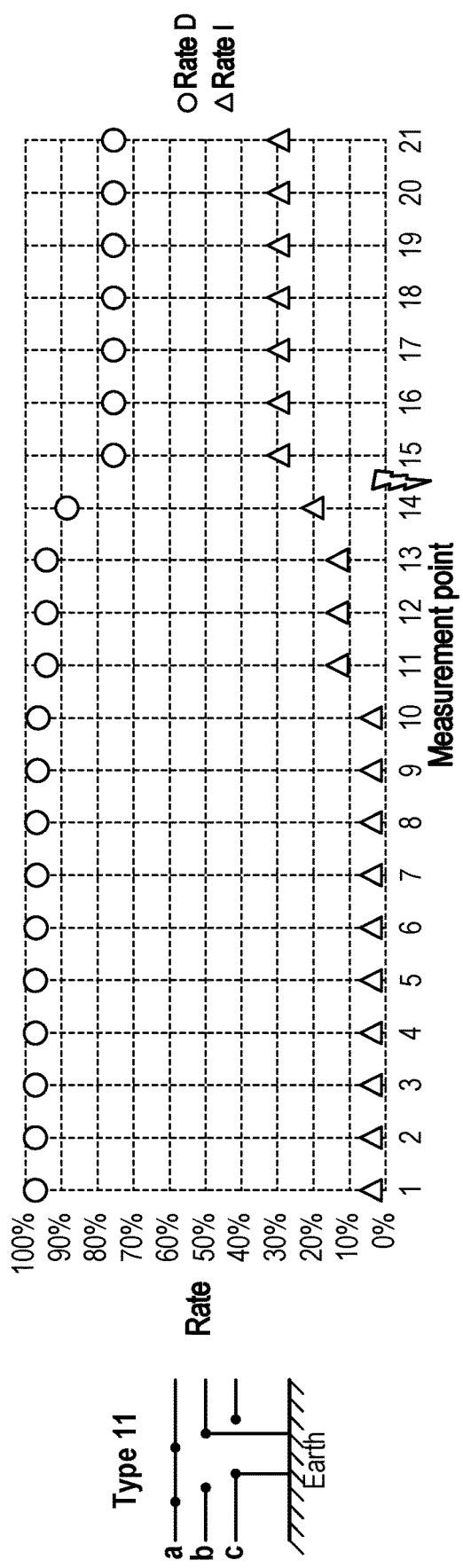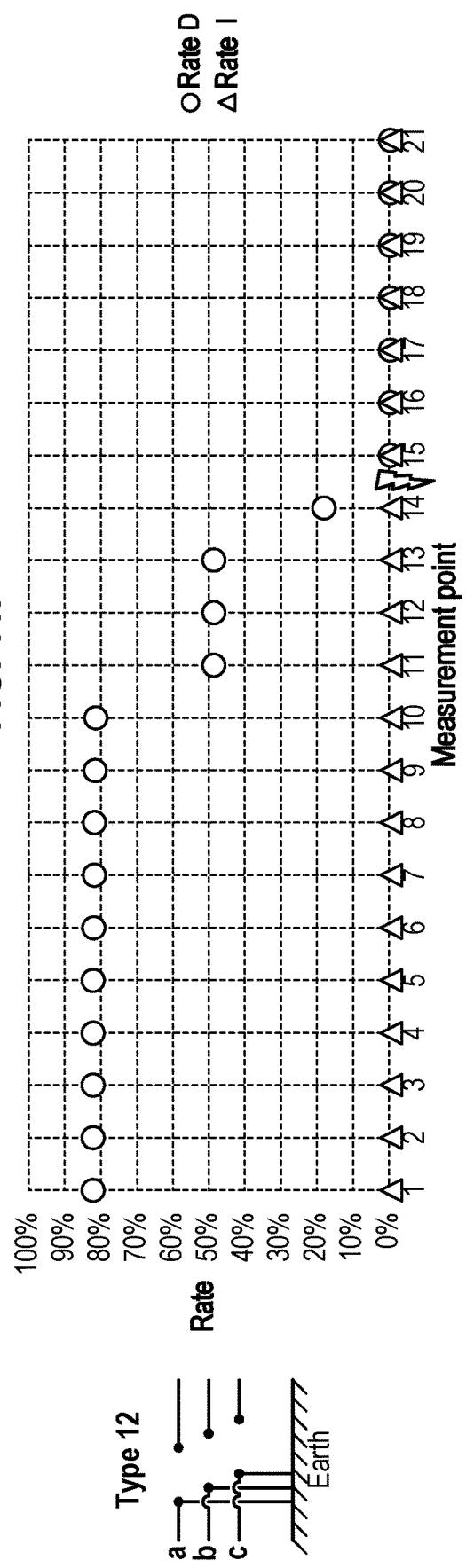

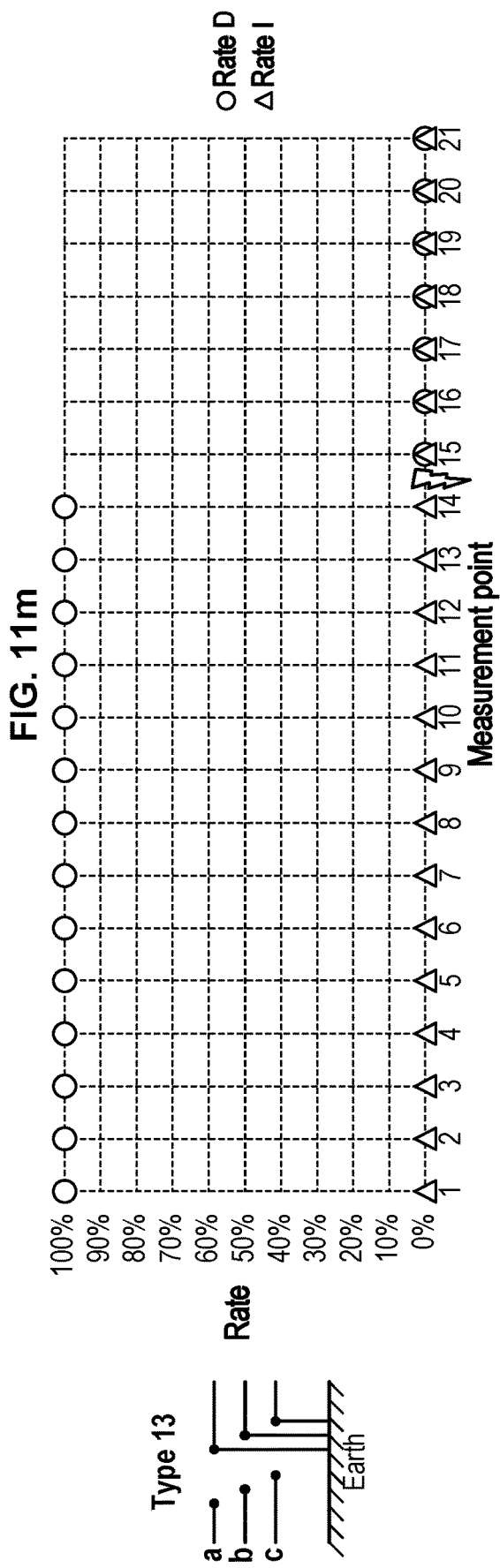

SYSTEM AND METHOD FOR LOCATING FAULTS ON A POLYPHASE ELECTRICAL NETWORK USING POSITIVE AND NEGATIVE SEQUENCE VOLTAGE VARIATION

CROSS-REFERENCE TO RELATED APPLICATIONS

The present application is a national phase entry under 35 U.S.C. § 371 of International Application No. PCT/EP2019/067262, filed Jun. 27, 2019, published in French, which claims priority from French Patent Application No. 1855883 filed Jun. 28, 2018, all of which are incorporated herein by reference.

FIELD OF THE INVENTION

The present invention relates to the location of faults on electrical networks.
More specifically, the invention relates to a system for detection and absolute location of faults with or without a line break over three-phase electrical power supply networks.

PRIOR ART

Faults on Electrical Networks:
Electrical networks are subject to faults that should be eliminated as soon as possible.
  A fault without a line break is, for example, the result of:
  a contact between the distribution line and a tree creating a short-circuit current to the earth;
  a mechanical contact on an underground network creating a short-circuit current between phases and/or to the earth, for example in the form of a pickaxe blow;
  the drop in the insulation quality of a worn cable creating a short-circuit current between phases and/or to the earth.
  A fault with line break occurs in the event of adverse weather conditions for example. The lines on either side of the break can fall to the ground which can, again, create short-circuits to the earth.

To eliminate the fault it is possible to de-energize the line or a part of the line undergoing the fault, which means no longer powering the line or line portion concerned.

To avoid or limit this inconvenience, it is possible to reduce the portion of the network to be de-energized and/or precisely locate the fault to carry out the necessary repairs and re-establish the service as quickly as possible.

In fact, to reduce the size of the portion of network to be de-energized, it is common to segment the electricity network into several zones, so that the network can be monitored and controlled by portions. Each zone is surrounded by two protectors. Each protector has the role of monitoring an adjacent zone. It only triggers if a fault is detected in a zone. For example, consider theoretically a line 1 including 5 different zones separated by protectors 2 making it possible to isolate each line portion from the other lines, as schematized in FIG. 1. Each zone is delimited by two protectors. If the fault appears in the third zone, with reference to FIG. 1:
  all the protectors 2 except for the protectors 3A and 3B perceive the fault 3, but they do not locate it in their zones. They are not triggered.
  the protectors 3A and 3B that monitor the fault perceive the fault 3 and locate it in their zones. They are then triggered to de-energize the concerned zone.

Theory Reminder:
For the repair operation to be carried out as quickly and effectively as possible, it is necessary to accurately locate the fault 3.

To study electrical networks in fault situations it is possible to use a mathematical method known as the Fortescue transform, typically used to break down a three-phase electrical network into three independent single-phase networks, known as positive sequence, negative sequence and zero sequence.

The change from the physical base "abc" of the voltages $V_a$, $V_b$, $V_c$ (in the sense of phases a, b and c), to the Fortescue base $V_d$, $V_i$, $V_o$ (Direct, Inverse, Homopolar) is done via the following system of equations:

$$V_a = V_d + V_i + V_o$$

$$V_b = a^2 V_d + a V_i + V_o$$

$$V_c = a V_d + a^2 V_i + V_o$$

With $$a = e^{j\frac{2\pi}{3}}$$

Any point of a three-phase network supplied by a direct source can be modeled by superimposition of three positive, negative and zero single-phase diagrams, as schematized in FIG. 2.

$$E = V_d + Z_d * I_d$$

$$0 = V_i + Z_i * I_i$$

$$0 = V_o + Z_o * I_o$$

With:
  $V_d$, $V_i$ and $V_o$: respectively positive sequence, negative sequence and zero sequence voltages at the point of the network under consideration;
  $I_d$, $I_i$, $I_o$: respectively positive sequence, negative sequence and zero sequence currents at the point of the network under consideration;
  $Z_d$, $Z_i$ et $Z_o$: respectively positive sequence, negative sequence and zero sequence impedances;
  E: equivalent positive sequence voltage at the generators of the supply network.

If the network is perfectly balanced, the negative sequence and zero sequence voltage components are zero: $V_i = V_o = 0$.

In this case, the voltage consists only of a positive sequence component $V_d$. The negative sequence and zero sequence voltages are zero.

If the network has a fault 3, there can be variations in the positive sequence and negative sequence voltages at the site of the fault 3. In the case of a single-phase fault 3, at the fault, we have:

$$Vd = \frac{Zi + Zo}{Zd + Zi + Zo} E$$

$$Vi = \frac{-Zi}{Zd + Zi + Zo} E$$

From these two equations, it appears that on a network with a very high-power short circuit, or a network with a highly impedant, isolated or compensated neutral, $Z_d$ and $Z_i$ are small compared to $Z_o$, then the negative sequence voltage drop and the negative sequence voltage rise linked to the appearance of a single-phase fault 3 are small.

In the case of an isolated two-phase fault 3, at the fault, we have:

$$Vd = Vi = \frac{Zi}{Zd + Zi}E$$

In the case of an isolated three-phase fault 3, at the fault, we have:

$$Vd = Vi = 0$$

Below, the "negative sequence voltage rate" is defined as being equal to the ratio of the negative sequence voltage $V_i$ to the nominal network voltage, such as $20000/\sqrt{3}$ for a high-voltage network of 20 kV, and "the positive sequence voltage rate" as being equal to the ratio of the positive sequence voltage $V_d$ to the nominal network voltage. These quantities are mentioned below to illustrate examples. However, these parameters are not limiting and the negative sequence and positive sequence voltages can also be made use of by the invention per se.

Different Modes of Location of Electrical Faults

The invention can be applied to two types of distribution network: mesh networks and non-mesh networks, the latter being sometimes referred to as "radial" or "tree" networks.

Generally, high-voltage networks (HV) are mesh networks 4 as illustrated in FIG. 3. In other words, a point of the high-voltage network is connected to at least two sources 4a so that it can always be supplied, even if one of the two sources 4a is not functional or if a portion of line is de-energized.

Average (MV) and low-voltage (LV) networks are generally non-mesh 5 as illustrated in FIG. 4 and have tree geometry. In this case, the opening of an element of the network, for example by a circuit breaker, causes the de-energizing of the entire downstream zone.

In the case of the mesh network 4 including several sources 4a of high voltage V1, V2, V3, there are protective relays 2 distributed across the different line sections, generally at the ends of the lines, capable of locating electrical faults 3, as illustrated in FIG. 3. This is for example the case of distance protectors.

The distance protectors 2 measure the electrical current and voltage in the place where they are installed. An impedance calculation on the basis of the current and voltage measurements makes it possible to determine at what distance a fault 3 is located, knowing the linear impedance of the lines 1. The problems posed by these relays are first that it is necessary to measure currents, which requires the installation of current transformers (coil around the line 1), and this is an expensive and complex solution in terms of installation.

Next, it is difficult, or even impossible to use distance protectors on tree networks 5 and heterogenous networks which have different types of power lines, so different impedances. Moreover, it is impossible to distinguish between faults 3 at the same distance 6 from the protective relay 2, but which are on different branches in the case of a tree network 5, as illustrated in FIG. 4.

Moreover, the detection and location of faults with line break in non-mesh networks for which, on the source side, the power lines are not in contact with the earth, are very difficult to detect as they are very resistant.

In this regard the document FR 2976 363 and its equivalent EP 2 533 060 disclose a device for detection and relative location of a fault 3 originating from a line break only, the device not functioning in the event that there is no line break, in a medium-voltage electrical network 5 using a comparison of the value of the negative sequence voltage with a threshold then, for the relative detection upstream or downstream of the measurement point, the comparison of the amplitude of the phase-neutral voltages at low voltage with the average of the amplitudes of all the phase-neutral voltages at low voltage, then finally, the comparison of the amplitude of the phase-neutral voltages at low voltage with a threshold. The implementation of this process requires the measurement of the phase voltages of the low-voltage network, which of course implies that the neutral is taken outside, and even if it is, it is necessary in the case of a three-phase network to equip 4 power lines, i.e. 3 phases and a neutral, whereas the present invention only uses the positive sequence and negative sequence voltages that can be computed only by measuring the 3 composite voltages and therefore equipping only 3 power lines, which of course, supposing that many MV-LV stations must be instrumented, represents a considerable saving. However, the application of the teaching of these documents remains complex. These documents propose to consider that a fault is detected when the negative sequence voltage exceeds a trigger threshold and to then attempt to locate the fault upstream or downstream of a measurement point, by measuring the phase voltage amplitudes, for example the RMS effective value, for each phase and by calculating their arithmetic mean, then by considering that if at least two norm values exceed the mean then the fault is upstream of the measurement point, but otherwise the minimum value of the phase voltage amplitudes is calculated and if this minimum value exceeds a threshold set in the form of a percentage of the nominal value of the network, the fault is upstream of the measurement point and otherwise it is downstream. Moreover, these documents also indicate that although theoretical studies indicate the possibility of using the negative sequence voltage and/or the zero sequence voltage on a MV network, the problems inherent to the measurement of voltage on medium-voltage phase power lines remain unsolved.

The means proposed in the documents FR 2 976 363 and EP 2 533 060 only function in the event of a line break on the electrical network. They do not work for faults without line breaks, which are also the subject of the present invention.

The document FR 3 028 620 describes other means for locating single-phase faults in a high-voltage distribution network which are based on the equation of the fault loop formed between the source station (and iteratively all the way to the start of the faulty section) and the fault resistance.

The document FR 2 936 378 describes a fault signaling device comprising current sensors. The means described in this document do not give complete satisfaction, in particular due to the fact that the installation of current sensors on an electrical network remains complex and expensive.

Other solutions proposed for the detection of faults on an electrical network are found in the documents US 2008/097706, JP 2004 061142, US 2017/336465, EP 0933643, DE 36 36 367 and IE S20 050 382.

SUMMARY OF THE INVENTION

In the context resulting from the prior art, the present invention has the aim of proposing new means for improving the performance of detection of faults with or without line break on electrical distribution lines.

One aim of the invention is particularly to propose a system making it possible to locate a fault with or without line break in an electrical network whatever the network topology, unlike a conventional fault detection method.

The present invention particularly has the aim of allowing fast, reliable and accurate detection of faults with or without line break on an electrical power supply line, without requiring expensive equipment.

The system according to the invention comprises a plurality of sensors distributed over the electrical network and suitable for measuring a parameter representative of the positive sequence voltage and/or the negative sequence voltage at each respective sensor and analyzing means suitable for analyzing the signals coming from the different sensors representative of the positive sequence voltage and/or the negative sequence voltage at each respective sensor, by searching for an extremum from among the signals coming from the sensors and for locating a fault at the sensor corresponding to this extremum.

The invention is advantageously completed by the following features, taken alone or in any one of their technical possible combinations:
- the analyzing means analyze the variation of the signal measured between each pair of measurement points surrounding a section of the network.
- the analyzing means compute for each network portion delimited by two points, the variation in the positive sequence and/or negative sequence voltage or the variation in the negative sequence and/or positive sequence voltage rate, to determine the extremum locating a fault when this variation is greater than a threshold.
- the sensors distributed over the electrical network are suitable for measuring a parameter representative of the negative sequence voltage at each respective sensor;
- the analyzing means search for the maximum of the signals corresponding to the parameter representative of the negative sequence voltage at each respective sensor to locate a fault at the sensor corresponding to this maximum;
- the sensors distributed over the network are suitable for measuring a parameter representative of the positive sequence voltage at each respective sensor;
- the analyzing means search for the minimum of the signals corresponding to the parameter representative of the positive sequence voltage at each respective sensor to locate a fault at the sensor corresponding to this minimum;
- the sensors distributed over the electrical network are suitable for measuring a parameter representative of the negative sequence voltage and a positive sequence voltage rate at each respective sensor, preferably by searching the maximum of the signals corresponding to the parameter representative of the negative sequence voltage and the minimum of the signals corresponding to the parameter representative of the positive sequence voltage at each respective sensor to locate a fault at the sensor corresponding to this maximum and to this minimum.

Such a system has the advantage of not requiring current measurements, which is an expensive solution in terms of network dimensioning.

Moreover, the positive sequence and negative sequence voltage rates at a point of the network are directly transmitted to the lower voltages. For example in FIG. 6 the rates measured at the points 11 of the network are transmitted to the LV networks 12 connected to the points 11. However these LV networks often have measurement points already installed for other requirements such as the metering of the energy distributed or the monitoring of voltage quality. These measurement points can therefore be re-used, which of course has the advantage of giving additional measurement points while limiting the associated costs.

The invention also relates to a method for detecting a fault in a medium and/or low-voltage network which comprises the steps consisting in measuring a parameter representative of the positive sequence voltage and/or the negative sequence voltage at a plurality of sensors distributed over the electrical network, analyzing the signals coming from the different sensors representative of the positive sequence voltage and/or the negative sequence voltage, and searching for an extremum from among the signals coming from the sensors to locate a fault at the sensor corresponding to this extremum.

The invention is advantageously completed by the following features, taken alone or in any of their technical possible combinations:
- the measurement step consists in measuring a parameter representative of the negative sequence voltage at each respective sensor;
- the analyzing means search for the maximum of the signals corresponding to the parameter representative of the negative sequence voltage at each respective sensor to locate a fault at the sensor corresponding to this maximum;
- the sensors distributed over the electrical network are suitable for measuring a parameter representative of the positive sequence voltage at each respective sensor;
- the analyzing means search for the minimum of the signals corresponding to the parameter representative of the positive sequence voltage at each respective sensor to locate a fault at the sensor corresponding to this minimum;
- each sensor measures the three phase-neutral voltages of the network or the three phase-phase voltages of the network;
- the analysis step makes use of the Fortescue Transform;
- the method is implemented a posteriori after de-energizing the network;
- the method is implemented in real time to control electrical cut-off members;
- the method is implemented by direct measurement on a protected line;
- the method is implemented by measurement on a network point connected to a protected line;
- the method is implemented by measurement at the hubs installed in MV/LV stations.
- the method is implemented by measurement at three-phase low-voltage smart meters installed at the level of users connected to the network;
- the method is implemented by measurement at a plurality of measurement points distributed over the network and sending of the signals coming from the sensors distributed over the network to a remote computer which effects the analyzing step;
- the method comprises a setting of a trigger threshold, advantageously greater than 2% for an negative sequence voltage;
- the method comprises a trigger threshold setting, advantageously less than 90% for a positive sequence voltage;

the measurement and analysis steps are implemented with an increment in the order of 400 ms for a medium-voltage MV network;

the measurement and analysis steps are implemented with an increment in the order of a few seconds for a low-voltage network LV protected by fuses;

the measurement and analysis steps are implemented with an increment less than the time lag of protective relays placed on the network.

Such a method has the advantage of accurately and quickly locating the fault in an electrical network to the nearest measurement point. Thus the zone de-energized to isolate the fault can be reduced to a minimum if opening members are installed along the line, and the fault search is very quick as the user knows its location.

Also, such a method has the advantage of being applicable to mesh or non-mesh networks.

The invention further comprises a medium- and/or low-voltage polyphase electrical network comprising a plurality of sensors distributed over the network and suitable for measuring a parameter representative of the positive sequence voltage and/or the negative sequence voltage at each respective sensor, by searching for an extremum from among the signals coming from the sensors and for locating a fault at the sensor corresponding to this extremum and/or means suitable for implementing the aforementioned method in accordance with the invention.

The invention is advantageously completed by the following features, taken alone or in any of their technical possible combinations:

the network is of tree type and in the event of a fault being detected the latter is identified upstream of the measurement point, i.e. on the side of the single source 4a, corresponding to the extremum.

the network is of mesh type and in the event of a fault being detected the latter is identified in proximity to the measurement point corresponding to the extremum.

DESCRIPTION OF THE FIGURES

Other features, aims and advantages of the invention will become apparent from the following description, which is purely illustrative and non-limiting, and which must be read with reference to the appended drawings wherein:

FIG. 10 represents a tree distribution network in accordance with the invention including several nodes and lines;

FIGS. 11a to 11m represent results of measurements of positive sequence and negative sequence voltage rates collected from a non-mesh (tree) network according to FIG. 10; more precisely FIG. 11a corresponds to the case of a single-phase fault by earthing of a phase, FIG. 11b corresponds to the case of a two-phase fault by coupling between two phases, FIG. 11c corresponds to the case of a three-phase fault by coupling between three phases, FIG. 11d corresponds to the case of a single-phase fault by a break of one phase, FIG. 11e corresponds to the case of a single-phase fault by earthing of a phase and a break downstream of the same phase, FIG. 11f corresponds to the case of a single-phase fault by earthing of a phase and breakage upstream of the same phase, FIG. 11g corresponds to the case of a single-phase fault by a break of a phase and earthing upstream and downstream of the break of the same phase, FIG. 11h corresponds to the case of a two-phase fault by a two-phase break, FIG. 11i corresponds to the case of a two-phase fault by a two-phase break and earthing of these two phases upstream of the breaks, and FIG. 11j corresponds to the case of a two-phase fault by a two-phase break and earthing of these two phases downstream of the ruptures.

In all the figures, similar elements bear identical reference numbers.

DETAILED DESCRIPTION OF THE INVENTION

System According to the Invention

Figure 1:
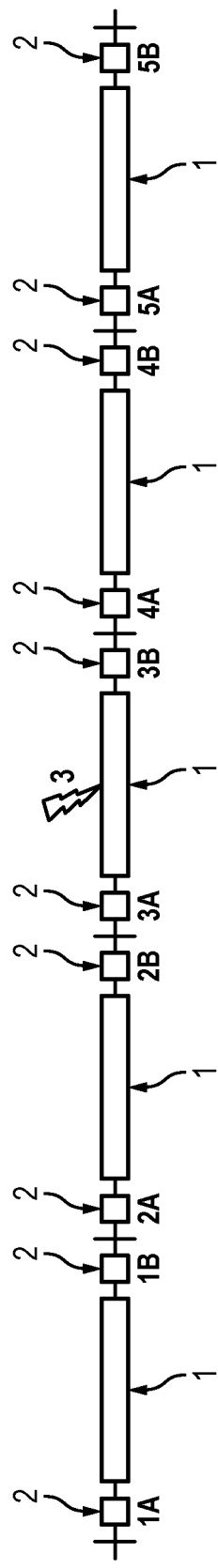
FIG. 1 already shown, schematically illustrates a conventional network protector in several segments.
Figure 2:
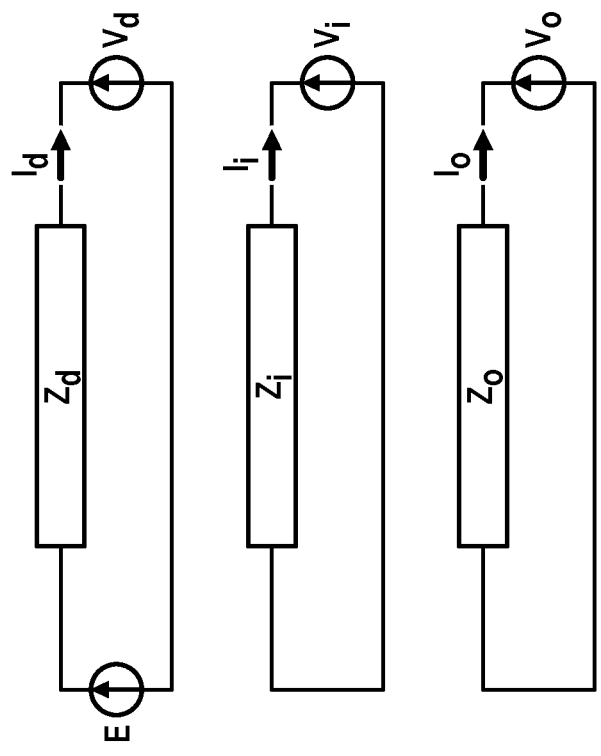
FIG. 2 already shown, illustrates a known network comprising a single electromotive force, broken down into three voltage and current components highlighting the superimposition of three regimes each corresponding to one of the positive sequence, negative sequence or zero sequence systems.
Figure 3:
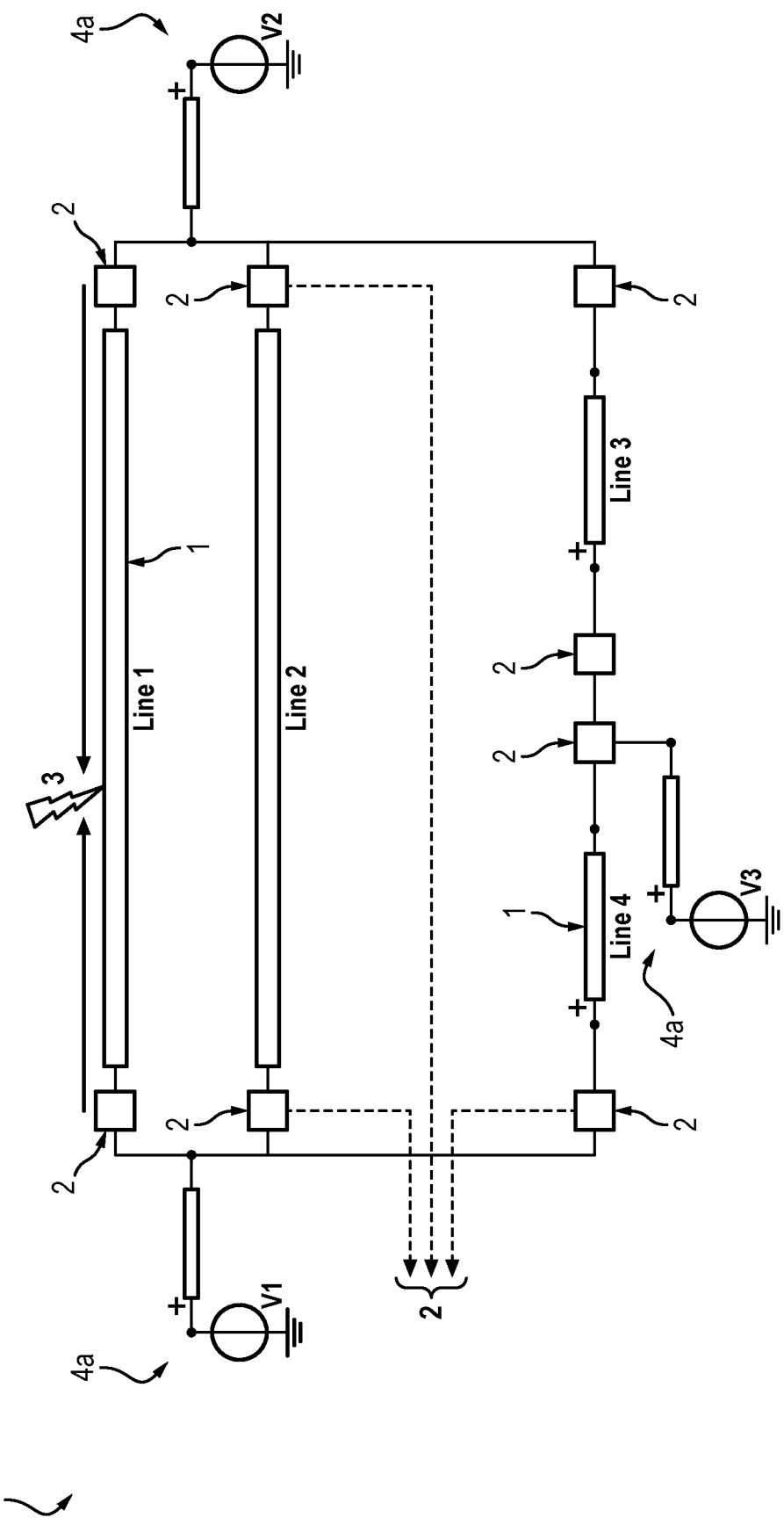
FIG. 3 already shown, illustrates a known embodiment of a mesh network and distance protectors.
Figure 4:
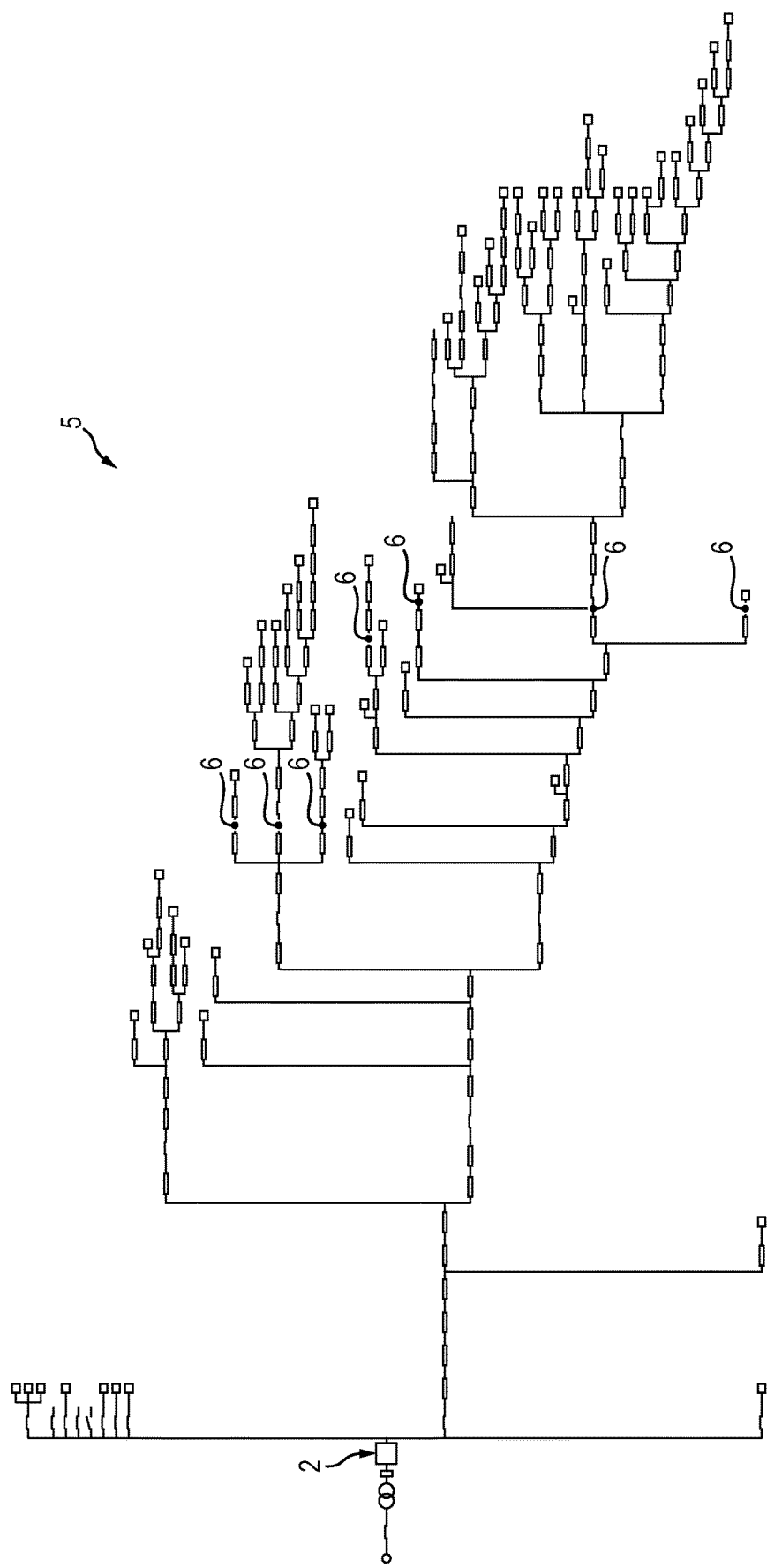
FIG. 4 already shown, represents a known tree network including several points equidistant from the protector relay.
Figure 5:
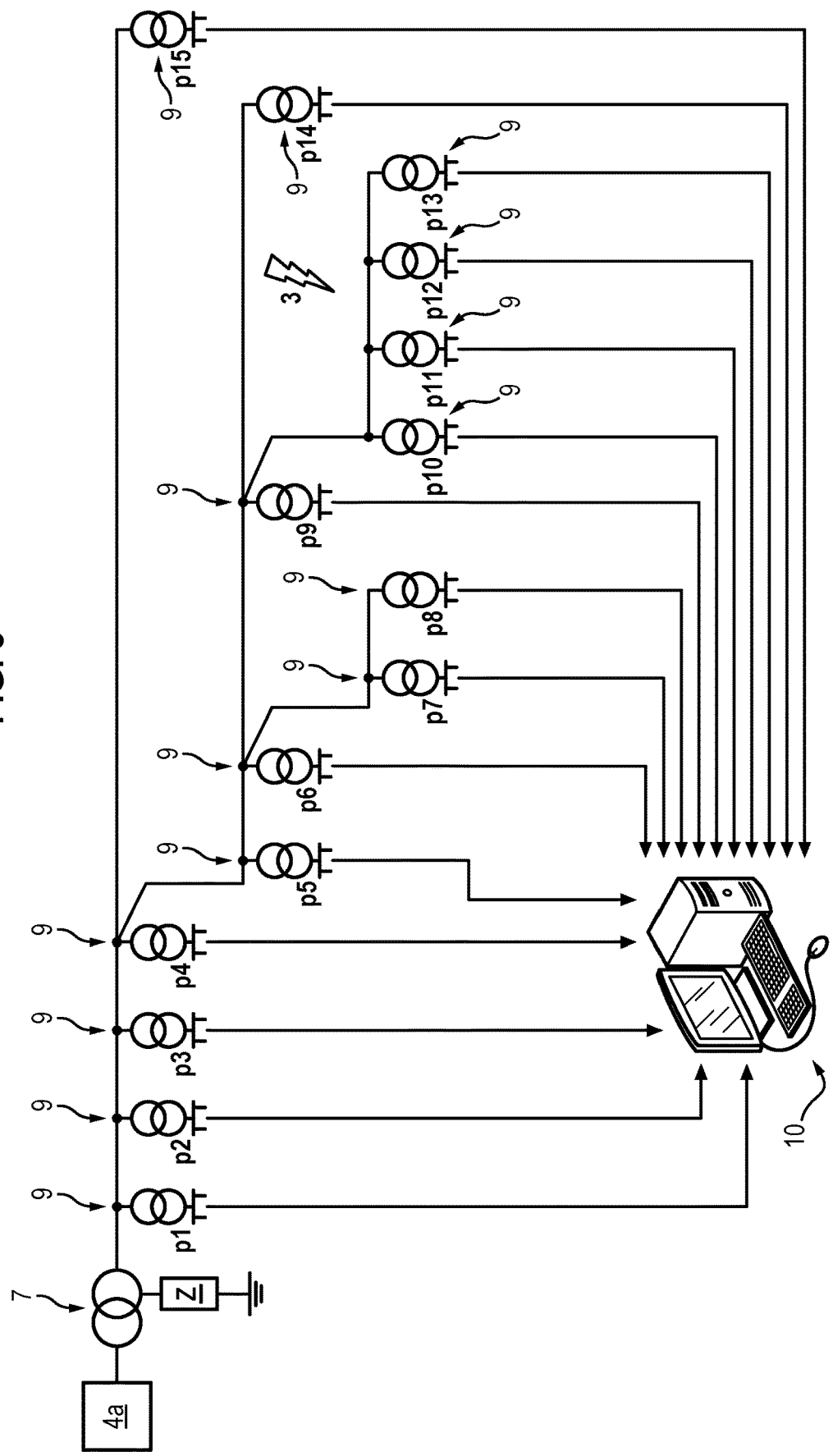
FIG. 5 schematically illustrates the principle of the invention.

A system for detecting a fault 3 in a polyphase electrical network 5 in accordance with the invention is shown in FIG. 5.

In an embodiment, an electrical network 5 comprises from upstream to downstream an electrical source 4a coming from the high-voltage HV network 4 at 63 kV, a transformer 7 used to convert the high voltage to MV medium voltage at 20 kV, 15 medium-low voltage MV-LV stations 9 equipped with transformers used to convert the medium voltage to a low voltage LV at 400 V and a remote computer 10 which communicates with each MV-LV station 9.

As indicated previously at each station 9 a sensor measures a parameter representative of the positive sequence voltage and/or the negative sequence voltage at this respective sensor.

Moreover the computer which receives the data from the aforementioned sensors analyzes the signals coming from the different sensors representative of the positive sequence voltage and/or the negative sequence voltage at each respective sensor, searches for an extremum from among the signals coming from the sensors and locates a fault at the sensor corresponding to this extremum.

Figure 6:
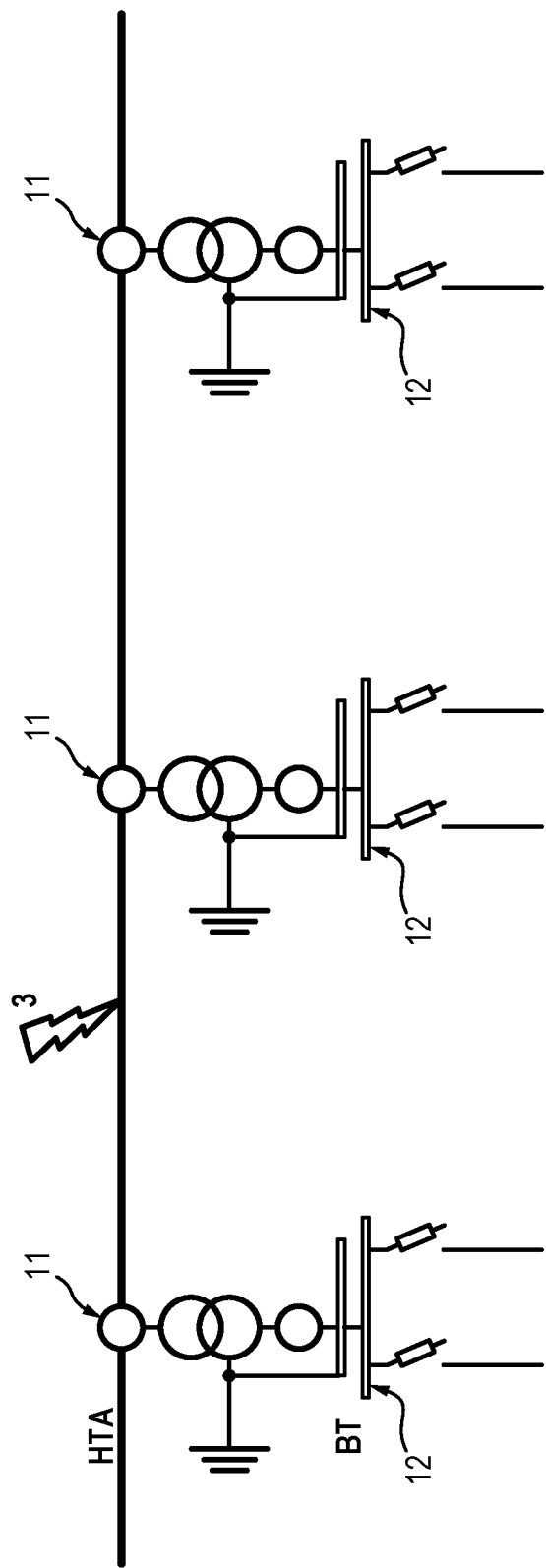
FIG. 6 represents the principle of location of a fault at MV using the measurements taken at MV and/or at LV.

With reference to FIG. 6, the measurement system according to the invention is capable of locating the fault 3 at MV using the measurements taken at MV 11 and/or at LV 12. This gives the invention a certain advantage as in the cases of MV networks 5 for example, the invention can use the measurement points already installed on MV or on LV, and in particular:

LV "Hubs" of communicating meters ("smart meters") installed in the MV-LV stations, on the LV side 12. These meters measure the voltages on the low-voltage network 5.

Furthermore, they possess a computer capable of computing the voltage values in Fortescue base, in particular the positive sequence and negative sequence voltages.

Three-phase Communicating meters of the LV customers.

Apart from cases of faults 3, the voltages of the networks 4, 5 are correctly balanced: the negative sequence voltages are close to 0%. Specifically for Europe the standard NF EN 50160 stipulates that, in the case of the negative sequence voltage:

Under normal operating conditions, for each period of one week, 95% of the effective values averaged over 10 mins of the negative sequence component of the supply voltage must be located between 0% and 2% of the positive sequence component.

Contrariwise, the presence of a fault creates a rise in the negative sequence voltage rate and indicates an anomaly in one of the stations of the network 4, 5.

The measurement points constantly measure the positive sequence and negative sequence voltages. These measurements are carried out with a smaller time increment than the minimum time of elimination of a fault 3 on the line 1 under consideration, or the time lag of the outgoing protector relay 2, typically:

In the order of 400 ms at MV.
In the order of a few seconds at LV for lines 1 protected with fuses.

As soon as:
The inverse voltage rate is greater than a parametrizable trigger threshold, for example greater than 2%,
And/or the positive sequence voltage rate is less than a parametrizable trigger threshold, for example 90%,
the values of the positive sequence and negative sequence rates measured are sent by a telecommunication means to the remote computer 10.

Note that the trigger thresholds are parametrizable, as the negative sequence (or positive sequence) voltage rate depends on the neutral regime of the network 4, 5 (neutral Z=40 Ohms, neutral Z=12 Ohms etc.). The threshold can be lowered (or increased) if the network 4, 5 is correctly balanced.

Method According to the Invention

The remote computer 10 positions the positive sequence and/or negative sequence voltage values for all the stations 9 of the network.

The computer can proceed to locate the position of the fault 3 and proceed to the partial resumption of the service, to any repairs and to the total resumption of service. In the case of networks 4, 5 whose faults 3 at the earth are liable to be self-extinguishing, as in the case of networks 4, 5 equipped with re-setters and networks 4, 5 with a compensated neutral, the user can ask the computer to return the network zones 4, 5 on which the most faults occurred. The operator can intervene to avoid these faults 3 appearing, which avoids nuisance to users due to these faults often turning from fleeting and self-extinguishing to permanent, which would lead to the de-energization of the network 4, 5.

The computer has knowledge of the network topology as well as the length of the lines.

For each network portion delimited by 2 measurement points m and n (→ there is no other measurement point between m and n), the computer knows:

L(m, n) the length of the portion between the points m and n

Taux_I(m) and Taux_D(m) the negative sequence and positive sequence voltage rates escalated by the measurement point m.

For each network portion delimited by 2 measurement points m and n, the invention computes the variation in the positive sequence EVOL_D and negative sequence EVOL_I rates per unit length, defined by $$\text{EVOL\_D} = \frac{Taux_{D(m)} - Taux_{D(n)}}{L(m, n)}$$

$$\text{EVOL\_I} = \frac{Taux\_I_{(m)} - Taux\_I(n)}{L(m, n)}$$

Let DELTA_EVOL_TAUX_MINI be a parametrizable value. This quantity is the value below which a variation in rate is considered as zero.

Also, for a non-mesh network, if two measurement points are at the ends of a section, the rate of which is less than DELTA_EVOL_TAUX_MINI, then in the following method, it is considered that the measurement point with the maximum negative sequence rate and the minimum positive sequence rate is the measurement point located on the source side.

Analysis on the basis of the derivatives per unit length of the measured signals, as indicated above, makes it possible to dispense with the interfering effect of low-power production sources connected to the network, for example photovoltaic sources, as the latter are liable to locally increase the positive sequence voltage and decrease the negative sequence voltage.

Figure 7:
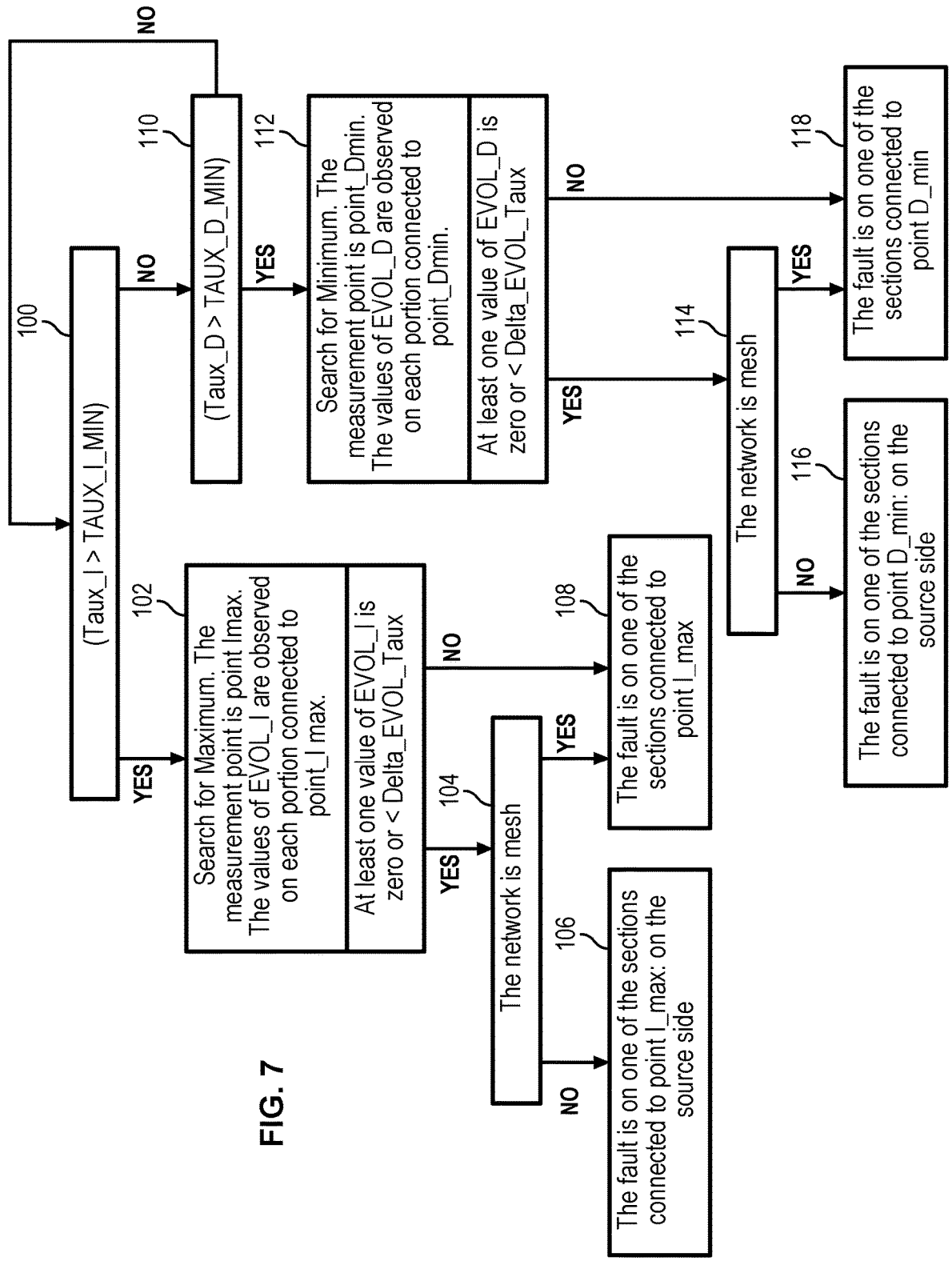
FIG. 7 illustrates a block diagram of a method for locating faults used to detect an extremum from among the signals coming from the sensors distributed over the electrical distribution network in accordance with the invention.

FIG. 7 illustrates an embodiment of the method according to the invention comprising the following steps for locating the fault:

Check the superiority of at least one negative sequence voltage rate Taux I with respect to a first parametrizable threshold TAUX_I_MIN (step 100), if the negative sequence voltage of at least one rate Taux_I is greater than the threshold TAUX_I_MIN, search for the maximum between the different measurement points, on each network portion connected to a measurement point as indicated previously (step 102). The measurement point that corresponds to this maximum is referenced POSTE_I_MAX.—if at least one derivative value EVOL_I is zero or less than a threshold DELTA_EVOL_TAUX_MINI, search for the network type to determine if the network is a mesh network (step 104), if the network is not a mesh network, it is considered that the fault is on the section connected to the measurement point Imax and located on the source side with respect to this measurement point (step 106)

if on the contrary the network is a mesh network, the steps 102 and 104 are followed by a step 108 during which it is considered only that the fault is on one of the sections connected to the measurement point, point Imax.

When the original step 100 leads to a negative result, the method effects a step 110 which consists in checking whether or not the variation in the positive sequence voltage Taux D is greater than a parametrizable threshold $D_{MIN}$.

If the result is negative, the method loops again via step 100. If the result is positive, on the contrary the method continues by steps 102, 104, 106 and 108 comparable to the aforementioned steps 112, 114, 116 and 118.

Thus:
if the variation in the positive sequence voltage Taux D is greater than the threshold Taux $D_{MIN}$, search for the minimum between the different measurement points on each portion of the network connected to a measurement point as previously indicated (step 112). The measurement point that corresponds to this minimum is referenced as point Dmin.

if at least one derivative value EVOL_D is zero or less than a threshold DELTA_EVOL_TAUX_MINI, search for the network type to determine whether or not the network is a mesh network (step 114), if the network is not a mesh network, it is considered that the fault is on the section connected to the measurement point Dmin and located on the source side with respect to this measurement point (step 116)

if on the contrary the network is a mesh network, the steps 112 and 114 are followed by a step 118 during which it is considered only that the fault is on one of the sections connected to the measurement point, point Dmin.

Results of the Voltages Measured at the Stations

Two examples of networks 4, 5 with faults are considered for the application of the method to the search for a negative sequence and/or positive sequence voltage extremum.

Figure 8:
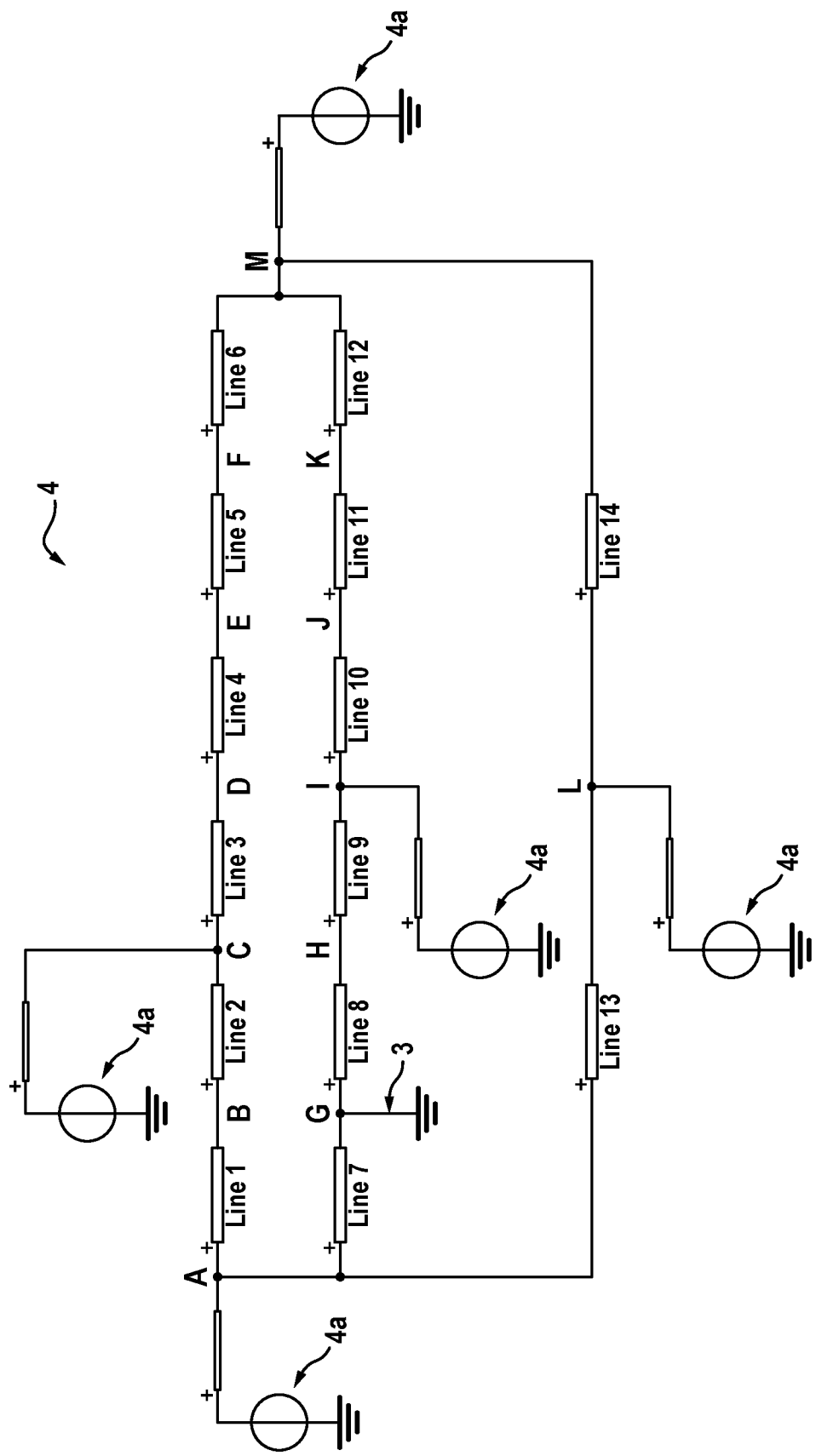
FIG. 8 represents a mesh distribution network in accordance with the invention including several nodes and lines.

First is considered a mesh network 4 at 225 kV with reference to FIG. 8. The network 4 includes 5 sources 4a with a short-circuit power of 500 MVA. The 5 sources 4a supply two portions of 6 lines and one portion of two mutually parallel lines. The nodes separating each line section are named in alphabetical order going from A to M. Each line section represents 10 km of line in the air. The nodes A, B, C, D, E, F, M are on the same line and the nodes A, G, H, I, J, K, M are on the same line. It is supposed that at the node G there appears a single-phase (phase-earth) fault 3, then a two-phase fault 3.

Figure 9A:
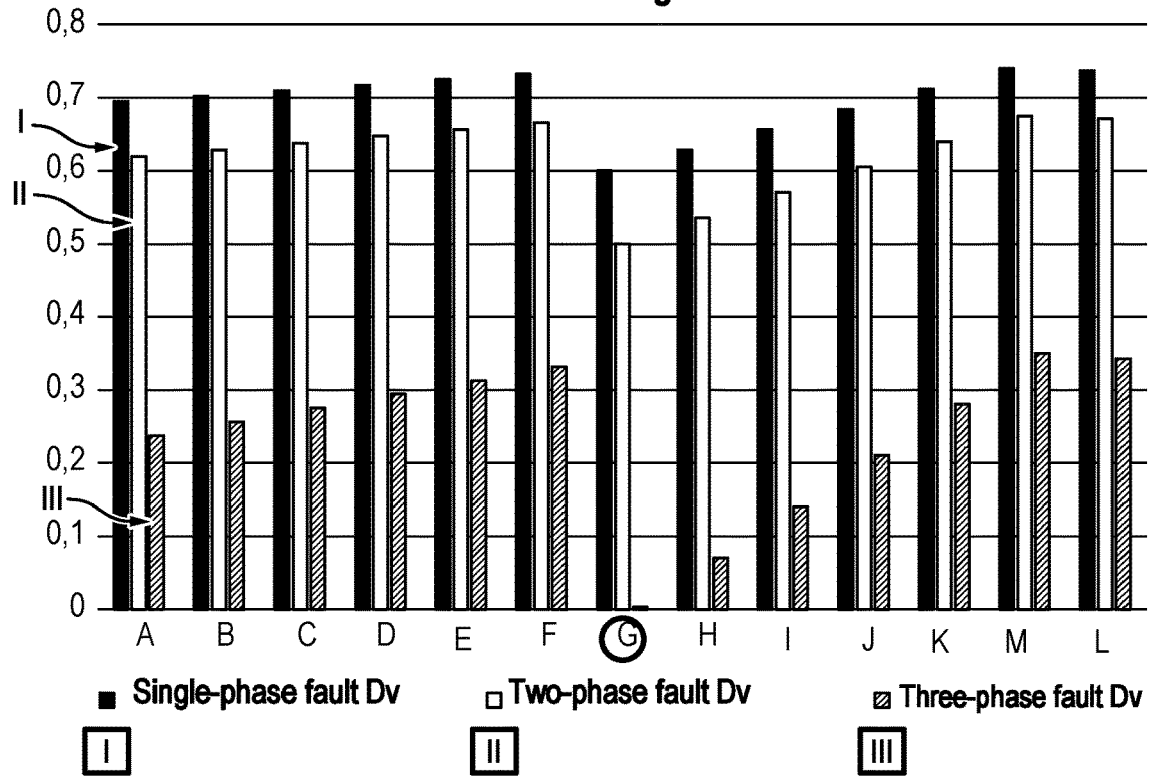
FIGS. 9a and 9b respectively represent results of measurements of positive sequence and negative sequence voltage rates based on a mesh network as per FIG. 8.
Figure 9B:
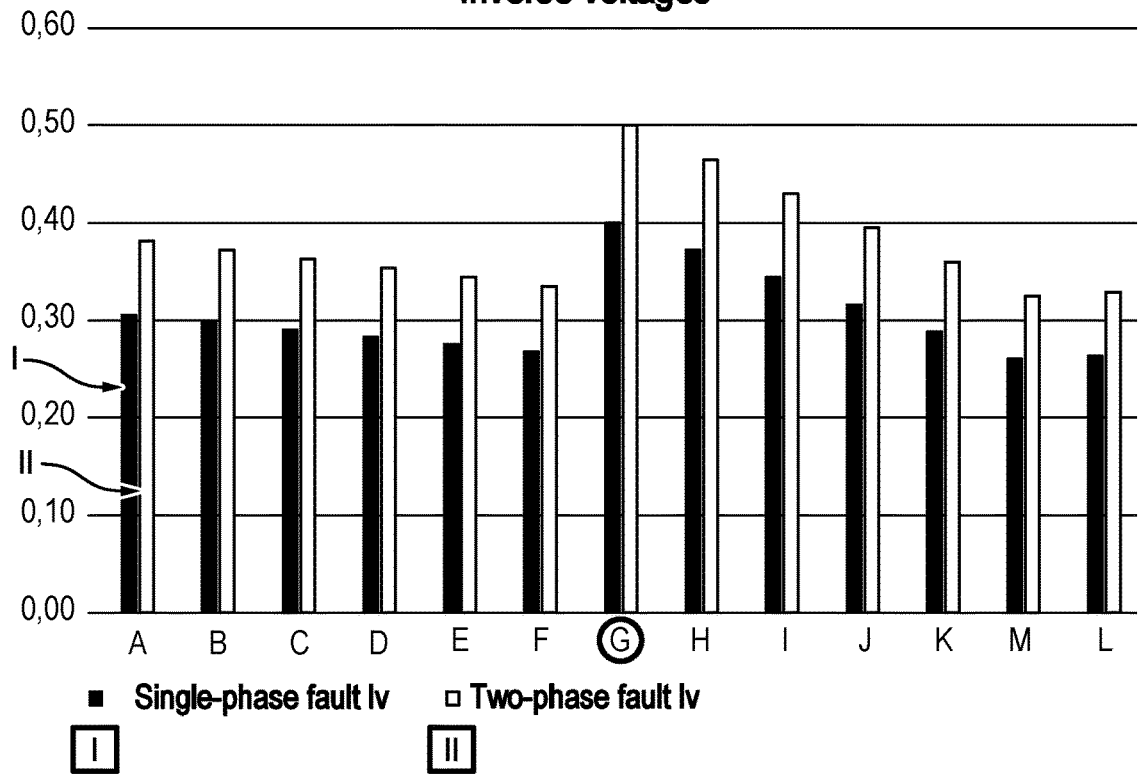
Figure 11C:
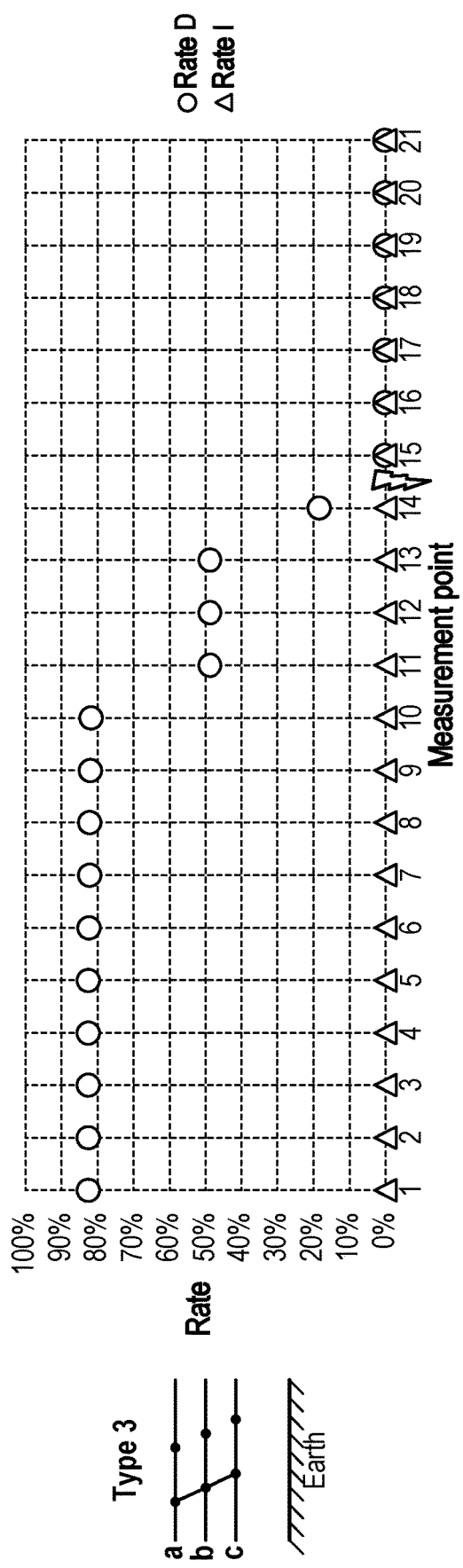
Figure 11D:
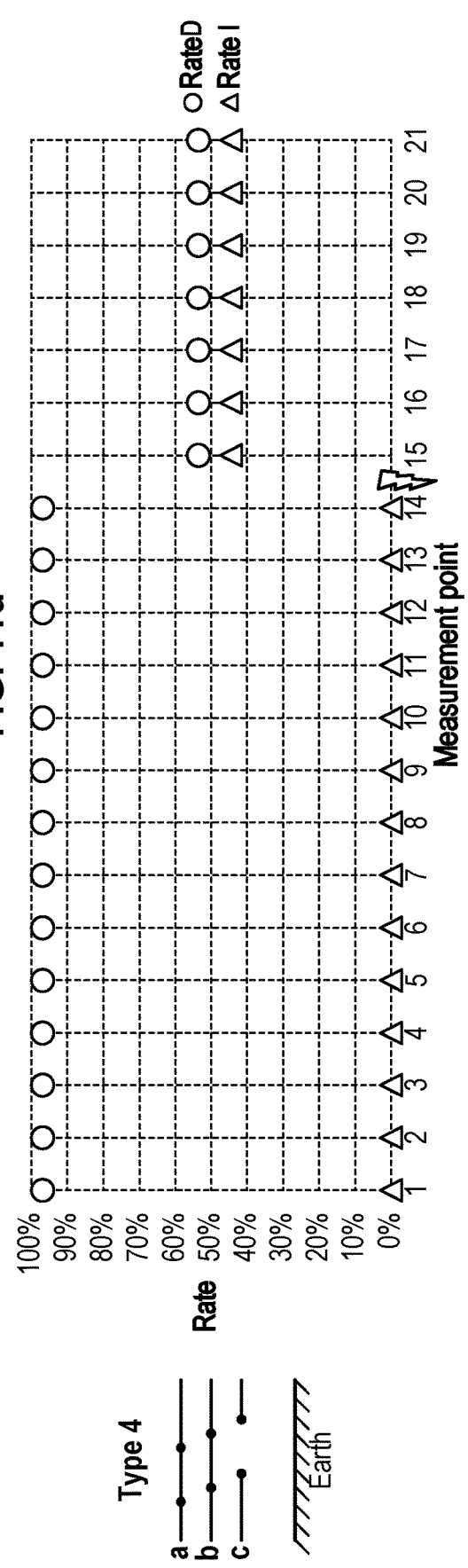
Figure 11I:
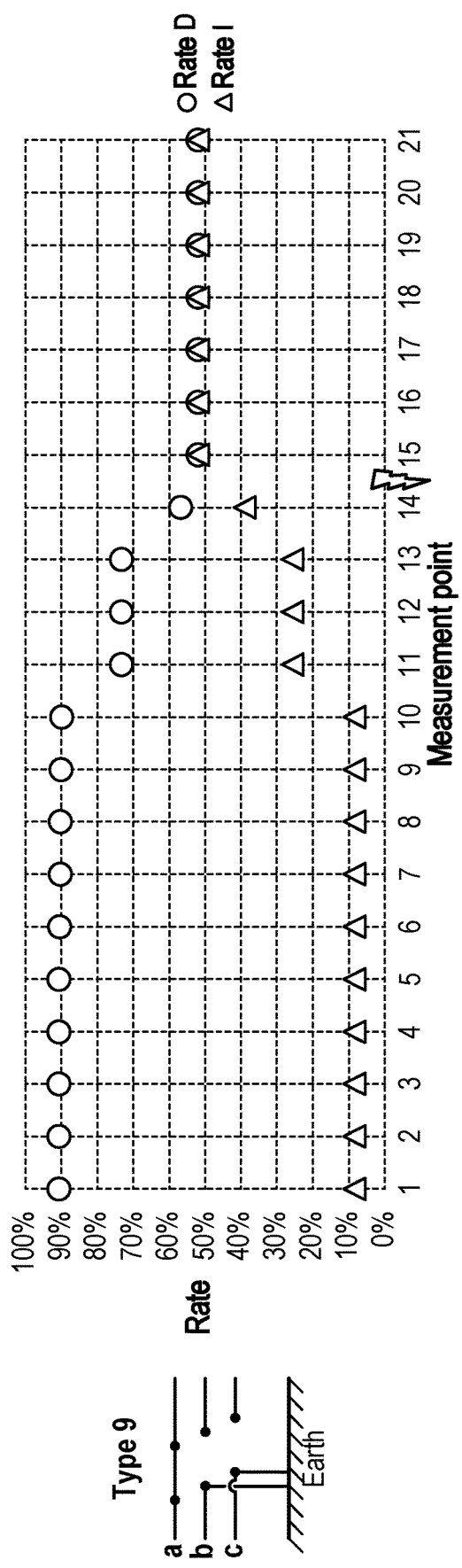
Figure 11J:
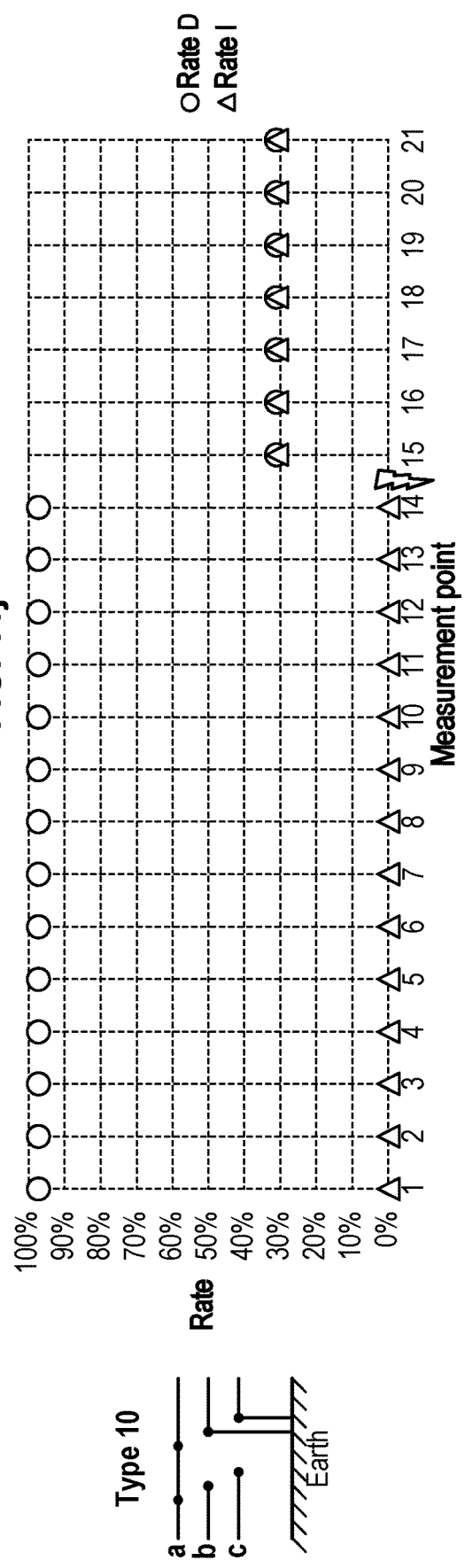

The positive sequence and inverse sequence voltages in percentages of their nominal values are respectively shown in FIGS. 9a and 9b. In particular, note that at the node where the fault 3 appears (node G), the first positive sequence voltage rate minimum of the line with reference to FIG. 9a corresponds to the first negative sequence voltage rate maximum with reference to FIG. 9b.

We will now consider a tree network 5 with reference to FIG. 10. From upstream to downstream, the network 5 includes a source 4a of very high voltage V1, a source station 7 (high-medium voltage transformer), a plurality of lines forming the tree to give in total 22 lines and 21 MV-LV stations with 200 kW of load which are at various tree sites, i.e. from P1 to P21. In this example, it is supposed that a fault of single-phase (phase-earth) type with or without line break, or two-phase with or without line break, or three-phase with or without line break, appears between the stations P14 and P15, bearing in mind that the stations P15 to P21 are on the same branch of the tree.

A voltage rate result for a method of earthing of the 40 Ohm resistive neutral of the transformer of the source station 7 is processed. Here again, in the site where the fault 3 is found (between stations P14 and P15), the first positive sequence voltage rate minimum corresponds to the first negative sequence voltage rate maximum as shown in FIGS. 11a to 11m.

FIGS. 11a to 11m demonstrate that the method for detecting and locating faults proposed in the context of the present invention is operational both for faults without line break and for faults resulting from a break in at least one power line.

Moreover, it is noted that the voltage rate values are the same for all the stations 9 downstream of the fault (P15 to P21), and therefore for these sections the variations in voltage or voltage rate are zero. This result agrees with the fact that the non-mesh network 5 only includes one source 4a and the fault 3 is located upstream of the measurement point.

These results prove that the method and system according to the invention make it possible to locate the position of the fault 3 by searching for the extremum of negative sequence and/or positive sequence voltages, for two types of network topology: mesh network 4 and non-mesh network 5.

Of course, the present invention is not limited to the embodiments that have just been described, but extends to all variants in the same spirit.

The invention claimed is:

1. A system for detecting a fault in a polyphase electrical network, comprising:
   a plurality of sensors distributed over the polyphase electrical network and suitable for measuring a parameter representative of a positive sequence voltage and/or a negative sequence voltage at each respective sensor; and
   one or more processors configured to:
      receive, from the plurality of sensors, signals representative of the positive sequence voltage and/or the negative sequence voltage at each respective sensor,
      identify, based on the received signals, an extremum from among the signals coming from the plurality of sensors; and
      locate, based on the identified extremum, the fault in the polyphase electrical network at the sensor corresponding to the identified extremum,
   wherein, for each network portion delimited by two measurement points m and n, the one or more processors are configured to determine a variation of positive sequence rates EVOL_D and/or a variation of negative sequence rates EVOL_I per unit length, respectively defined by:

$$EVOL\text{-}D = \frac{Taux_{D(m)} - Taux_{D(n)}}{L(m, n)}; \text{ and}$$

$$EVOL\_I = \frac{Taux\_I_{(m)} - Taux\_I(n)}{L(m, n)};$$

wherein:
   L (m, n) is the length of the network portion between the two measurement points m and n,
   Taux_D(m) is the positive sequence rate corresponding to the ratio between the positive sequence voltage at the measurement point m and the nominal network voltage,
   Taux_D(n) is the positive sequence rate corresponding to the ratio between the negative sequence voltage at the measurement point n and the nominal network voltage,
   Taux_I(m) is the negative sequence rate corresponding to the ratio between the negative sequence voltage at the measurement point m and the nominal network voltage, and
   Taux_I(n) is the negative sequence rate corresponding to the ratio between the negative sequence voltage at the measurement point n and the nominal network voltage.

2. The system as claimed in claim 1, wherein the one or more processors are further configured to determine that a detected fault is located on a source side with respect to a measurement point of this extremum in the case of a non-mesh tree network, and located in proximity to the measurement point corresponding to the extremum on one of sections connected to the measurement point of this extremum in the case of a mesh network.

3. The system as claimed in claim 1, wherein the parameter measured by each sensor of the plurality of sensors is a parameter representative of the negative sequence voltage at each the respective sensor.

4. The system as claimed in claim 3, wherein the one or more processors are further configured to search for a maximum of the signals corresponding to the parameter representative of the negative sequence voltage at each respective sensor to locate the fault in the polyphase electrical network at the sensor corresponding to this maximum.

5. The system as claimed in claim 1, wherein the parameter measured by each sensor of the plurality of sensors is a parameter representative of the positive sequence voltage at the sensor.

6. The system as claimed in claim 5, wherein the one or more processors are further configured to identify, for a minimum of the signals corresponding to the parameter representative of the positive sequence voltage at each respective sensor, a location of the fault in the polyphase electrical network at the sensor corresponding to this minimum.

7. The system as claimed in claim 1, wherein the parameter representative of the negative sequence voltage measured by a sensor of the plurality of sensors is the negative sequence rate equal to the ratio between the negative sequence voltage at the sensor and the nominal network voltage and wherein the parameter representative of the positive sequence voltage measured by a sensor of the plurality of sensors is the positive sequence rate equal to the ratio between the positive sequence voltage at the sensor and the nominal network voltage.

8. A method for detecting a fault in a medium and/or low-voltage electrical network, comprising the steps of:
determining a parameter representative of a positive sequence voltage and/or a negative sequence voltage at a plurality of sensors distributed over the medium and/or low-voltage electrical network,
receiving, from the plurality of sensors, signals representative of the positive sequence voltage and/or the negative sequence voltage, and
identifying, based on the received signals, an extremum to locating, based on the identified extremum the fault in the medium and/or low-voltage electrical network at the sensor corresponding to the identified extremum,
determining, for each network portion delimited by two measurement points m and n, a variation of positive sequence rates EVOL_D and/or a variation of negative sequence rates EVOL_I per unit length, respectively defined by:

$$EVOL\_D = \frac{Taux_{D_{(m)}} - Taux_{D_{(n)}}}{L(m, n)}; \text{ and}$$

$$EVOL\_I = \frac{Taux\_I_{(m)} - Taux\_I_{(n)}}{L(m, n)};$$

wherein:
L(m, n) is the length of the network portion between the two measurement points m and n,
Taux_D(m) is the positive sequence rate corresponding to the ratio between the positive sequence voltage at the measurement point m and the nominal network voltage, Taux_D(n) is the positive sequence rate corresponding to the ratio between the negative sequence voltage at the measurement point n and the nominal network voltage, Taux_I(m) is the negative sequence rate corresponding to the ratio between the negative sequence voltage at the measurement point m and the nominal network voltage, and Taux_I(n) is the negative sequence rate corresponding to the ratio between the negative sequence voltage at the measurement point n and the nominal network voltage.

9. The method as claimed in claim 8, comprising steps of searching for a nature of the electrical network, non-mesh tree or mesh, and determining that the fault in the medium and/or low-voltage electrical network is located on a source side with respect to a measurement point of an extremum in the case of a non-mesh tree network and that the fault in the medium and/or low-voltage electrical network is located in proximity to the measurement point corresponding to the extremum on one of sections connected to the measurement point of this extremum in the case of a mesh network.

10. The method as claimed in claim 8, wherein the step of measuring a parameter representative consists in measuring the parameter representative of the negative sequence voltage at each respective sensor.

11. The method as claimed in claim 10, wherein the step of searching for an extremum comprises searching for a maximum of the signals corresponding to the parameter representative of the negative sequence voltage at each respective sensor to locate the fault in the medium and/or low-voltage electrical network at the sensor corresponding to this maximum.

12. The method as claimed in claim 8, wherein the step of measuring a parameter representative consists in measuring the parameter representative of the positive sequence voltage at each respective sensor.

13. The method as claimed in claim 12, wherein the step of searching for an extremum comprises searching for a minimum of the signals corresponding to the parameter representative of the positive sequence voltage at each respective sensor to locate the fault in the medium and/or low-voltage electrical network at the sensor corresponding to this minimum.

14. The method as claimed in claim 8, wherein each sensor of the plurality of sensors measures the three phase-neutral voltages of the network or the three phase-phase voltages of the network.

15. The method as claimed in claim 8, wherein the step of analyzing makes use of a Fortescue Transform.

16. The method as claimed in claim 8, being implemented a posteriori, after de-energizing the network.

17. The method as claimed in claim 8, being implemented in real time to control electrical cut-off members.

18. The method as claimed in claim 8, being implemented by direct measurement on a protected line.

19. The method as claimed in claim 8, being implemented by measurement on a network point connected to a protected line.

20. The method as claimed in claim 8, being implemented by measurement at hubs installed in MV/LV stations.

21. The method as claimed in claim 8, being implemented by measurement at three-phase low-voltage smart meters installed at the level of users connected to the network.

22. The method as claimed in claim 8, being implemented by measurement at a plurality of measurement points distributed over the network and sending of the signals coming from the sensors distributed over the network to a remote computer which effects the step of analyzing.

23. The method as claimed in claim 8, wherein the parameter representative of the negative sequence voltage measured by a sensor of the plurality of sensors is a negative sequence rate equal to the ratio between the negative sequence voltage at the sensor and the nominal network voltage and further comprising a step of comparing the negative sequence voltage rate with respect to a settable trigger threshold, advantageously of detecting a negative sequence rate greater than 2%.

24. The method as claimed in claim 8, wherein the parameter representative of the positive sequence voltage measured by a sensor of the plurality of sensors is the positive sequence rate equal to the ratio between the positive sequence voltage at the sensor and a nominal network voltage and further comprising a step of comparing the positive sequence voltage rate with respect to a settable trigger threshold, advantageously of detecting a positive sequence voltage rate less than 90%.

25. The method as claimed in claim 8, wherein the steps of measuring and analyzing are implemented with an increment in the order of 400 ms for a medium-voltage MV network.

26. The method as claimed in claim 8, wherein the steps of measuring and analyzing are implemented with an increment in the order of a few seconds for a low-voltage network LV protected by fuses.

27. The method as claimed in claim 8, wherein the steps of measuring and analyzing are implemented with an increment less than the time lag of protective relays placed on the network.

28. A polyphase electrical network, comprising a system in accordance with claim 1 for detecting a fault in the polyphase electrical network.

29. The network as claimed in claim 28, being of tree type and in the event of the fault being detected by the analyzing means, the fault is identified upstream of a measurement point with respect to the user side corresponding to the extremum.

30. The network as claimed in claim 28, being of mesh type and in the event of the fault being detected by the analyzing means, the fault is identified in proximity to the measurement point corresponding to the extremum.

* * * * *